(12) United States Patent
Bhattacharya et al.

(10) Patent No.: US 11,443,092 B2
(45) Date of Patent: Sep. 13, 2022

(54) DEFECT WEIGHT FORMULAS FOR ANALOG DEFECT SIMULATION

(71) Applicant: Synopsys, Inc., Mountain View, CA (US)

(72) Inventors: Mayukh Bhattacharya, Palo Alto, CA (US); Miroslava Tzakova, San Jose, CA (US); Chih-Ping Antony Fan, Saratoga, CA (US)

(73) Assignee: Synopsys, Inc., Mountain View, CA (US)

(*) Notice: Subject to any disclaimer, the term of this patent is extended or adjusted under 35 U.S.C. 154(b) by 201 days.

(21) Appl. No.: 16/872,048

(22) Filed: May 11, 2020

(65) Prior Publication Data

US 2021/0350058 A1 Nov. 11, 2021

(51) Int. Cl.
*G06F 30/367* (2020.01)
*G06K 9/62* (2022.01)

(52) U.S. Cl.
CPC .......... *G06F 30/367* (2020.01); *G06K 9/623* (2013.01); *G06K 9/628* (2013.01)

(58) Field of Classification Search
CPC ....... G06F 30/367; G06K 9/623; G06K 9/628
See application file for complete search history.

(56) References Cited

U.S. PATENT DOCUMENTS

| | | | | |
|---|---|---|---|---|
| 7,512,508 | B2* | 3/2009 | Rajski | G01R 31/31704 702/81 |
| 10,353,789 | B1* | 7/2019 | Najibi | G06F 30/30 |
| 10,634,621 | B2* | 4/2020 | Kano | G06T 7/0002 |
| 10,902,579 | B1* | 1/2021 | Soltanmohammadi | G06V 10/82 |
| 11,182,525 | B1* | 11/2021 | Sokar | G06F 30/27 |
| 2010/0229061 | A1* | 9/2010 | Hapke | G01R 31/318342 714/740 |
| 2021/0150696 | A1* | 5/2021 | Bidault | G06N 3/04 |
| 2021/0173007 | A1* | 6/2021 | Landman | G01R 31/2894 |
| 2021/0326506 | A1* | 10/2021 | Bhattacharya | G06F 30/367 |
| 2021/0357693 | A1* | 11/2021 | Kim | G06N 3/08 |

* cited by examiner

*Primary Examiner* — Wesley J Tucker
(74) *Attorney, Agent, or Firm* — Sterne, Kessler, Goldstein & Fox P.L.L.C.

(57) ABSTRACT

A method, apparatus, and/or computer program product can perform an analog defect simulation on an electronic device. The method, apparatus, and/or computer program product can generate a defect catalog which identifies a defect class relating to a defect and a modeling parameter that is associated with the defect class. The method, apparatus, and/or computer program product can receive a weight formula that identifies a weight for the defect class in relation to the modeling parameter. The method, apparatus, and/or computer program product can call a defect weight function to return the weight from the defect weight formula. The method, apparatus, and/or computer program product can perform the analog defect simulation on the electronic device. The method, apparatus, and/or computer program product can determine a simulation statistic relating to the analog defect simulation utilizing the weight.

20 Claims, 7 Drawing Sheets

FIG. 4

DEFECT WEIGHT FORMULAS FOR ANALOG DEFECT SIMULATION

TECHNICAL FIELD

The present disclosure relates to analog defect simulation and including determining defect weight formulas for the analog defect simulation.

BACKGROUND

Advances in technology and engineering have allowed designers and manufacturers to offer more electronic devices to consumers. These electronic devices often represent mixed signal electronic devices that include both analog signal and digital signal environments. The analog signal environment includes analog components that primarily operate upon various analog inputs while the digital signal environment includes digital components that primarily operate upon digital inputs. Often times, the designers and/or the manufacturers utilize electronic design automation (EDA), also referred to as electronic computer-aided design (ECAD), throughout the design of these mixed signal electronic devices. Design for testing, also referred to as design for testability (DFT), techniques for the digital signal environment have become much more advanced. As a result, chances of failure in the digital components within these mixed signal electronic devices are much lower than the chances of failure in the analog components within these mixed signal electronic devices. However, a vast majority of failures of the mixed signal electronic devices themselves can be attributed to the analog signal environment.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 illustrates an operational control flow for generating a defect catalog according to an exemplary embodiment of the present disclosure;

DETAILED DESCRIPTION

Figure 1:
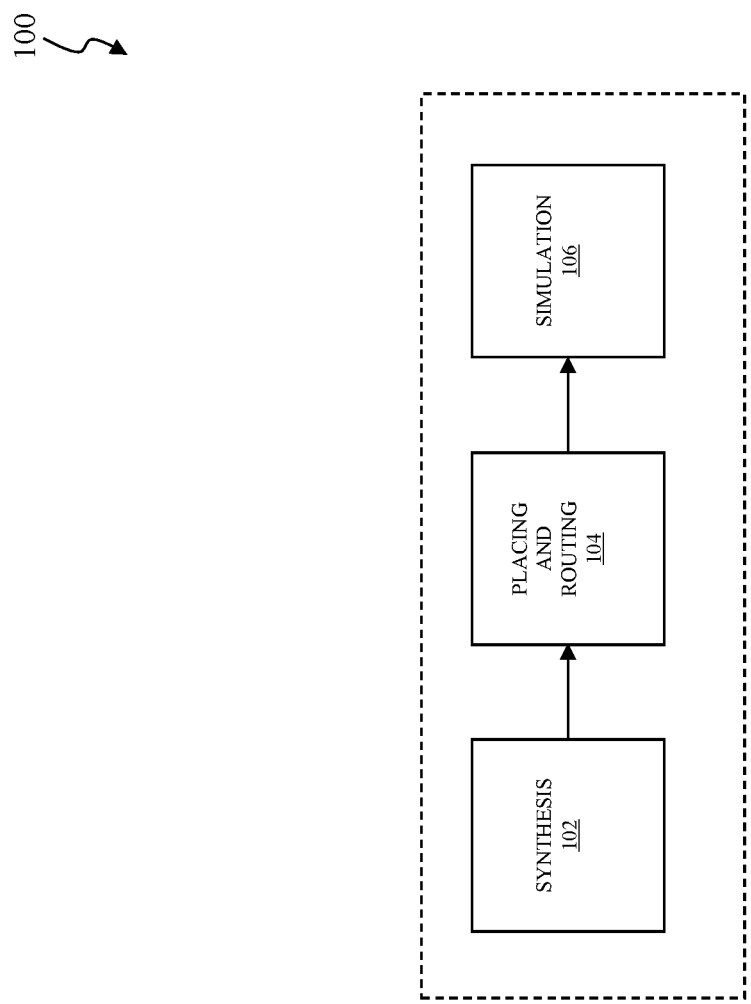
FIG. 1 illustrates a block diagram of an electronic design platform according to an exemplary embodiment of the present disclosure.

Manufacturing test coverage refers to a percentage of defects, such as stuck-on faults, stuck-off faults, open circuit faults, and/or short circuit faults to provide some examples, that can be detected within one or more analog components of one or more analog circuits and/or the one or more analog circuits themselves. The manufacturing test coverage is typically related to the number of analog components and/or one or more analog circuits returned from the field. Generally, the manufacturing test coverage can be expressed as:

$$DL = 1 - Y^{(1-TC)}, \quad (1)$$

where DL represents a ratio of the number of defective analog components and/or defective analog circuits shipped to the total number of analog components and/or the total number of analog circuits shipped, also referred to as the Defect Level, Y represents the yield of the manufacturing process, and TC represents the test percentage, or test coverage, of analog components and analog circuits which are tested for defects prior to shipping.

Properly assessing test coverage (TC) for analog components and/or analog circuits often necessitates accurate and reasonably fast analog defect simulation capability. Also, advanced driver-assist systems (ADAS) are becoming ubiquitous in modern automobiles and are projected to continue to grow as the automotive industry proceeds onto hands-off-eyes-off autonomous vehicles. Most of the analog circuits and/or the electronic devices at the heart of various ADAS technologies have significant analog components. Analog defect simulation of mission-critical circuit components is often suggested as a methodology to compute various quality metrics recommended by the functional safety standards for production automobiles, such as International Organization for Standardization (ISO) 26262 describing for functional safety of electrical and/or electronic systems in production automobiles.

Unlike digital defects in digital components and/or digital circuits, analog defects in analog components and/or analog circuits are usually associated with various weights related to relative likelihoods of the occurrence of these defects. Expressing these weights can be difficult to standardize and/or simplify because of the variety of parameters available for analog components, the variety of types of analog components, and the ever-evolving nature of manufacturing technology. These weights are often dependent on the distributions of sizes and electrical properties of the analog components themselves, and the critical area of the analog circuits having these analog components. Based on the available information at any given stage in the design and/or manufacture process, designers and manufacturers may use various mathematical formulas to calculate relative likelihoods and, hence, weights of various defects, and thereafter utilize these mathematical formulas for simulating defects, such as stuck-on faults, stuck-off faults, open circuit faults, and/or short circuit faults to provide some examples, within one or more analog components of one or more analog circuits and/or the one or more analog circuits themselves. However, these analog components and/or analog circuits can be mathematically modeled using wide varieties of different mathematical models and, often times, generic weight formulas may not accurately represent these analog components and/or analog circuits.

Aspects of the present disclosure relate to determining defect weight formulas for analog defect simulation. The analog defect simulation of the present disclosure, as to be further described in detail below, provides a systematic approach to determining the defect weight formulas for analog defect simulation. This approach effectively groups defects into one or more unique defect classes having similar modeling parameters. This allows defect weight formulas to be determined for these unique classes from their modeling parameters. These defect weight formulas can be used to calculate the weights for each of these unique defect classes before proceeding with analog defect simulation.

Exemplary Electronic Design Platforms

FIG. 1 illustrates a block diagram of an electronic design platform according to an exemplary embodiment of the present disclosure. As illustrated in FIG. 1, an electronic design platform 100 represents a design flow including one or more electronic design software applications, that when executed by one or more computing devices, processors, controllers, or other devices that will be apparent to those skilled in the relevant art(s) without departing from the scope of the present disclosure, can design, simulate, analyze, and/or verify one or more high-level software level descriptions of analog circuits of an electronic device. In an exemplary embodiment, the one or more high-level software level descriptions can be implemented using a high-level software language, such as a graphical design application, for example C, System C, C++, LabVIEW®, and/or MATLAB®, a general purpose system design language, such as a systems modeling language (SML), a semantic model definition language (SMDL), and/or a store schema definition language (SSDL), or any other suitable high-level software or general purpose system design language that will be apparent to those skilled in the relevant art(s) without departing from the scope of the present disclosure, or a high-level software format, such as Common Power Format (CPF), Unified Power Formant (UPF), or any other suitable high-level software format that will be apparent to those skilled in the relevant art(s) without departing from the spirit and the scope of the present disclosure. In the exemplary embodiment illustrated in FIG. 1, the electronic design platform 100 includes a synthesis application 102, a placing and routing application 104, and a simulation application 106.

Moreover, embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc. In an exemplary embodiment, the synthesis application 102, the placing and routing application 104, and/or the simulation application 106 can represent one or more electronic design software applications, which when executed by one or more computing devices, processors, controllers, or other devices that will be apparent to those skilled in the relevant art(s) without departing from the spirit and the scope of the present disclosure, configure the one or more computing devices, the processors, the controllers, or the other devices from being general purpose electronic devices into special purpose electronic devices to execute one or more of these applications as to be described in further detail below.

The synthesis application 102 translates one or more characteristics, parameters, or attributes of the electronic device into one or more logic operations, one or more arithmetic operations, one or more control operations, and/or any other suitable operation or operations that will be apparent to those skilled in the relevant art(s) without departing from the spirit and the scope of the present disclosure into the one or more high-level software level descriptions in relation to one or more analog circuits of the electronic device. Although the discussion of FIG. 1 to follow describes the electronic device as including analog circuits, those skilled in the relevant art(s) will recognize that the teachings herein are equally applicable to mixed signal electronic devices that include both analog circuits and digital circuits without departing from the scope of the present disclosure. The synthesis application 102 can utilize a simulation algorithm to simulate the one or more logic operations, one or more arithmetic operations, one or more control operations, and/or the other suitable operation or operations to verify the one or more logic operations, one or more arithmetic operations, one or more control operations, and/or the other suitable operation perform in accordance with one or more characteristics, parameters, or attributes of the electronic device as outlined in an electronic design specification.

The placing and routing application 104 translates the one or more high-level software level descriptions to form an electronic architectural design for the one or more analog circuits of the electronic device. The placing and routing application 104 selects various analog components corresponding to the one or more analog circuits of the electronic device to translate the one or more logic operations, the one or more arithmetic operations, the one or more control operations, and/or the other suitable operation or operations of the one or more high-level software level descriptions. After selecting the analog components, the placing and routing application 104 places these components onto an electronic device design real estate to initiate formation of the electronic architectural design for the electronic device. Once the placing and routing application 104 places the one or more selected standard cells onto the electronic device design, the placing and routing application 104 routes the placed analog components to form the electronic architectural design for the one or more analog circuits of the electronic device.

The simulation application 106 simulates the electronic architectural design for the electronic device to replicate one or more characteristics, parameters, or attributes of the electronic architectural design for one or more analog circuits of the electronic device. In an exemplary embodiment, the simulation application 106 can provide a static timing analysis (STA), a voltage drop analysis, also referred to an IREM analysis, a Clock Domain Crossing Verification (CDC check), a formal verification, also referred to as model checking, equivalence checking, or any other suitable analysis that will be apparent to those skilled in the relevant art(s) without departing from the spirit and the scope of the present disclosure. In a further exemplary embodiment, the simulation application 106 can perform an alternating current (AC) analysis, such as a linear small-signal frequency domain analysis, and/or a direct current (DC) analysis, such as a nonlinear quiescent point calculation or a sequence of nonlinear operating points calculated while sweeping a voltage, a current, and/or a parameter to perform the STA, the IREM analysis, or the other suitable analysis. Moreover, the simulation application 106 can further simulate the electronic architectural design for defects, such as stuck-on faults, stuck-off faults, open circuit faults, and/or short circuit faults to provide some examples. As to be described in further detail below, this simulation can include an exemplary analog defect simulation for simulating these defects, such as stuck-on faults, stuck-off faults, open circuit faults, and/or short circuit faults to provide some examples, within one or more analog components within the one or more analog circuits and/or the one or more analog circuits themselves.

Exemplary Analog Defect Simulation

Figure 2:
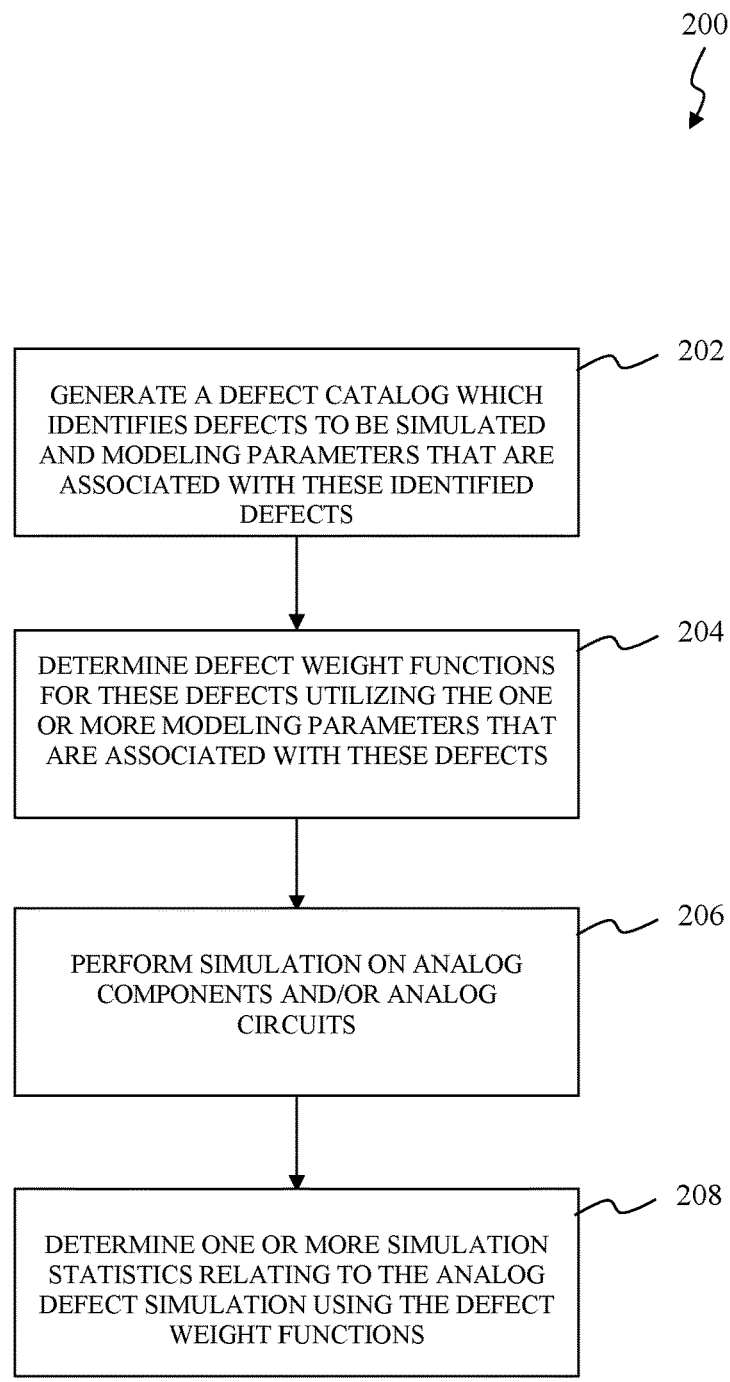
FIG. 2 illustrates a flowchart of an analog defect simulation according to an exemplary embodiment of the present disclosure.

FIG. 2 illustrates a flowchart of an analog defect simulation according to an exemplary embodiment of the present disclosure. The disclosure is not limited to this operational description. Rather, it will be apparent to ordinary persons skilled in the relevant art(s) that other operational control flows are within the scope of the present disclosure. The following discussion describes an exemplary operational control flow 200 for simulating defects, such as stuck-on faults, stuck-off faults, open circuit faults, and/or short circuit faults to provide some examples, within one or more analog components and/or one or more analog circuits of one or more electronic devices. In the exemplary embodiment illustrated in FIG. 2, one or more computer systems, to be described in further detail below, can execute the simulation application 106, as described above in FIG. 1, to perform the operational control flow 200 as to be described in further detail below.

At operation 202, the exemplary operational control flow 200 generates a defect catalog which identifies one or more classes of defects to be simulated and one or more modeling parameters that are associated with these identified defects. In the exemplary embodiment illustrated in FIG. 2, the defect catalog is effectively grouped into one or more unique defect classes having similar modeling parameters. In this exemplary embodiment, the defect catalog further identifies one or more modeling parameters that are associated with the one or more unique defect classes.

At operation 204, the exemplary operational control flow 200 generates defect weight functions for the one or more unique defect classes identified in the defect catalog from operation 202 in terms of one or more defect weight formulas. In the exemplary embodiment illustrated in FIG. 2, the one or more defect weight formulas identify one or more weights for the one or more unique defect classes in relation to the one or more modeling parameters that are associated with the one or more unique defect classes in the defect catalog from operation 202. In the exemplary embodiment illustrated in FIG. 2, the exemplary operational control flow 200 can express the one or more defect weight formulas in a programming language to provide the one or more defect weight functions. The programming language can include assembler instructions, instruction-set-architecture (ISA) instructions, machine instructions, machine dependent instructions, microcode, firmware instructions, state-setting data, or either source code or object code written in any combination of one or more higher level languages, such as procedural programming languages, for example, the C programming language or similar programming languages (such as SystemC), or object oriented programming language such as Python®, Smalltalk®, C++ or the like, and any other suitable programming languages that will be apparent to those skilled in the relevant art(s) without departing from the scope of the present disclosure. In the exemplary embodiment illustrated in FIG. 2, the one or more defect weight functions, when called by the exemplary operational control flow 200 as to be described in further detail below, return one or more weights outlined by the one or more defect weight formulas. In some embodiments, the exemplary operational control flow 200 can store the defect weight formulas in one or more libraries, such as one or more dynamic-link libraries (DLLs) to provide an example, which can be called by the exemplary operational control flow 200 as to be described in further detail below.

At operation 206, the exemplary operational control flow 200 performs the exemplary analog defect simulation in accordance with the defects identified in the defect catalog from operation 202. In the exemplary embodiment illustrated in FIG. 2, the exemplary operational control flow 200 effectively models the defects identified in the defect catalog from operation 202 within the one or more analog components and/or the one or more analog circuits of one or more electronic devices. Generally, the exemplary analog defect simulation iteratively simulates the behavior of the one or more analog components and/or one or more analog circuits by iteratively modeling the one or more analog components and/or one or more analog circuits to include the defects identified in the defect catalog from operation 202. In the exemplary embodiment illustrated in FIG. 2, the exemplary analog defect simulation initially determines a scope of the analog defect simulation. The scope of the analog defect simulation can represent an exhaustive simulation where the defects identified in the defect catalog from operation 202 are to be simulated or a non-exhaustive simulation where some of the defects identified in the defect catalog from operation 202 are to be simulated. For the non-exhaustive simulation, in the exemplary embodiment illustrated in FIG. 2, the exemplary operational control flow 200 can receive a defect sample size threshold indicating a number of defects from among the defects identified in the defect catalog from operation 202 that are to be simulated. In this exemplary embodiment, the exemplary operational control flow 200 can select these defects based upon their corresponding weights in accordance with the defect weight functions from operation 204. For example, the defect sample size threshold can indicate that one hundred (100) defects identified in the defect catalog from operation 202 are to be simulated. In this example, the exemplary operational control flow 200 can utilize the defect weight functions from operation 204 to select the one hundred (100) defects from the defect catalog from operation 202 having the greatest weights.

Next, the exemplary analog defect simulation iteratively injects each defect to be simulated from the defect catalog from operation 202 into the one or more analog components and/or one or more analog circuits and, thereafter, iteratively simulates the one or more analog components and/or one or more analog circuits with each injected defect from the defect catalog from operation 202 to determine the behavior of the one or more analog components and/or one or more analog circuits. In the exemplary embodiment illustrated in FIG. 2, the exemplary analog defect simulation simulates the one or more analog components and/or one or more analog circuits in accordance with one or more analog defect testing vectors. The one or more analog testing vectors define one or more electronic signals, such as input signals, power supply characteristics, and/or clocking signals to provide some examples, that are to be utilized by the exemplary analog defect simulation during the simulation. During this simulation, the exemplary analog defect simulation measures one or more analog parameters, such as one or more voltages, one or more currents, one or more frequencies, and/or one or more phases to provide some examples, at one or more circuit nodes within the one or more analog components and/or one or more analog circuits. The exemplary analog defect simulation thereafter compares the one or more measured analog parameters with expected values for these analog parameters to determine whether the injected defect from the defect catalog from operation 202 caused a failure in the one or more analog components and/or one or more analog circuits. When the injected defect from the defect catalog from operation 202 causes the failure in the one or more analog components and/or one or more analog circuits, this defect from the defect catalog from operation 202 can be characterized as being covered by the exemplary analog defect simulation.

At operation 208, the exemplary operational control flow 200 determines one or more simulation statistics, such as an analog test coverage to provide an example, relating to the exemplary analog defect simulation from operation 206 utilizing the one or more weights from the defect weight functions from operation 204. In the exemplary embodiment illustrated in FIG. 2, the exemplary operational control flow 200 can call the defect weight functions from operation 204 to return the one or more weights and thereafter utilize the one or more weights to determine the one or more simulation statistics. In some embodiments, the exemplary operational control flow 200 can access the defect weight functions from operation 204 which are stored in the one or more libraries, such as one or more dynamic-link libraries (DLLs) to provide an example, from operation 204.

As an example, for the exhaustive simulation as described above, the exemplary operational control flow 200 can determine its analog test coverage by:

$$TC_{EHX} = 100 * \frac{\sum W_{COVERED\_DEFECTS}}{\sum W_{ALL\_DEFECTS}}, \quad (2)$$

where $TC_{EHX}$ represents a numerical value indicative of a coverage of the exemplary analog defect simulation, $W_{COVERED\_DEFECTS}$ represents weights of those defects that are covered, namely, caused the failure in the one or more analog components and/or one or more analog circuits, by the exemplary analog defect simulation, and $W_{ALL\_DEFECT}$ represents weights of all defects. In the exemplary embodiment illustrated in FIG. 2, the weights of those defects that are covered and the weights of all defects can be obtained by exemplary operational control flow 200 from the defect weight functions from operation 204 as described above. As another example, for the non-exhaustive simulation as described above, the exemplary operational control flow 200 can determine its analog test coverage by:

$$TC_{NCN-EHX} = 100 * \frac{\sum W_{COVERED\_DEFECTS}}{\sum W_{SAMPLED\_DEFECTS}}, \quad (3)$$

where $_{NON-EHX}$ represents a numerical value indicative of a coverage of the exemplary analog defect simulation, $W_{COVERED\_DEFECTS}$ represents weights of those defects that are covered, namely, caused the failure in the one or more analog components and/or one or more analog circuits, by the exemplary analog defect simulation, and $W_{SAMPLED\_DEFECT}$ represents weights of only those defects simulated by the exemplary analog defect simulation. Generally, each weight from among the $W_{SAMPLED\_DEFECT}$ can be adjusted and/or modified to reflect the sampling strategy utilized for the non-exhaustive simulation. In an exemplary embodiment, the defects from among the $W_{SAMPLED\_DEFECT}$ can be selectively chosen from the weights of all the defects in accordance with a sampling algorithm, such as the Sunter sampling algorithm as described in "Practical Random Sampling of Potential Defects for Analog Fault Simulation," IEEE International Test Conference (ITC), Paper 2.3, 2014, which is incorporated herein by reference in its entirety. For example, if a defect is chosen to be included within the $W_{SAMPLED\_DEFECT}$, namely, sampled, because its corresponding weight was extremely high, namely, then its true weight is used without any adjustment and/or modification. As another example, if a defect is chosen to be included within the $W_{SAMPLED\_DEFECT}$, namely, sampled, randomly from the stratum it represents, then its weight is adjusted and/or modified to be a one (1) because this chosen defect can represent many other defects within its stratum. In the exemplary embodiment illustrated in FIG. 2, the weights of those defects that are covered and the weights of only those defects simulated by the exemplary analog defect simulation can be obtained by the exemplary operational control flow 200 from the defect weight functions from operation 204 as described above.

Exemplary Defect Catalog

Figure 3:
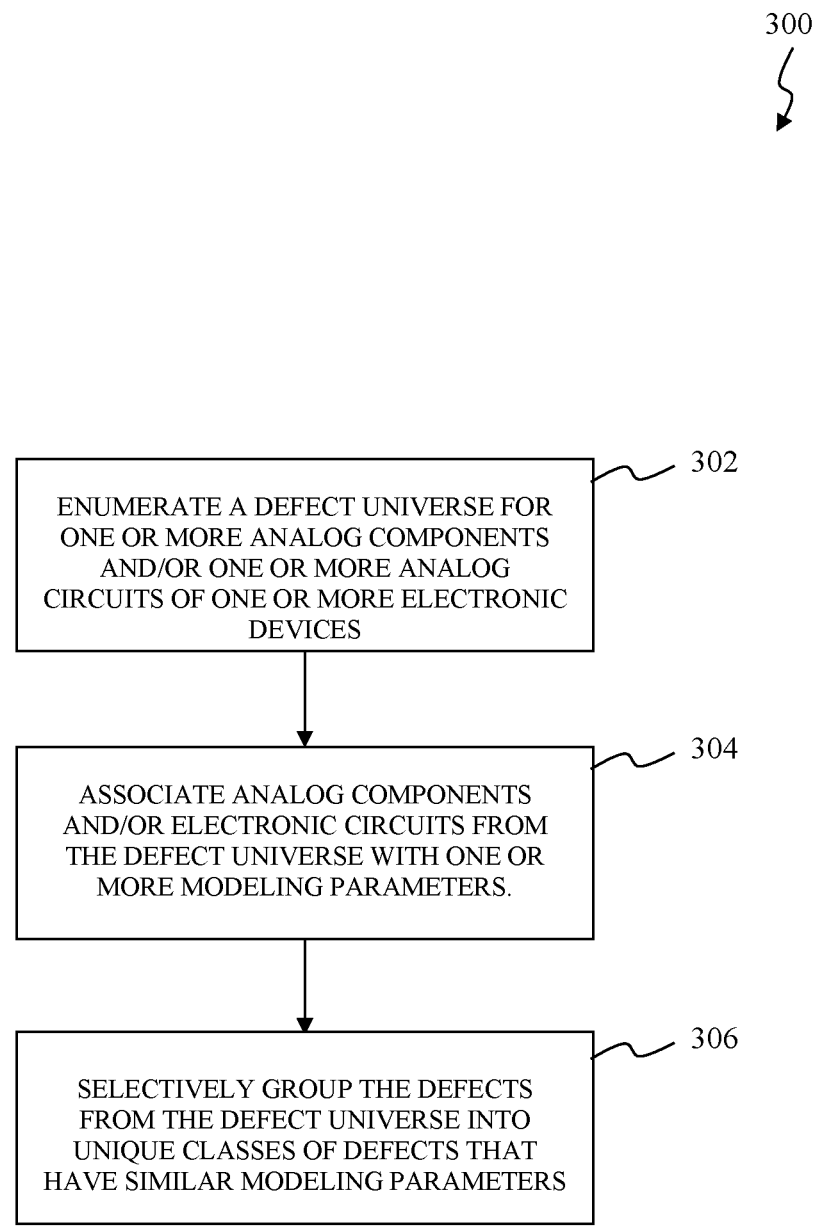
FIG. 3 illustrates a flowchart of an operational control flow for generating a defect catalog according to an exemplary embodiment of the present disclosure.
Figure 4:
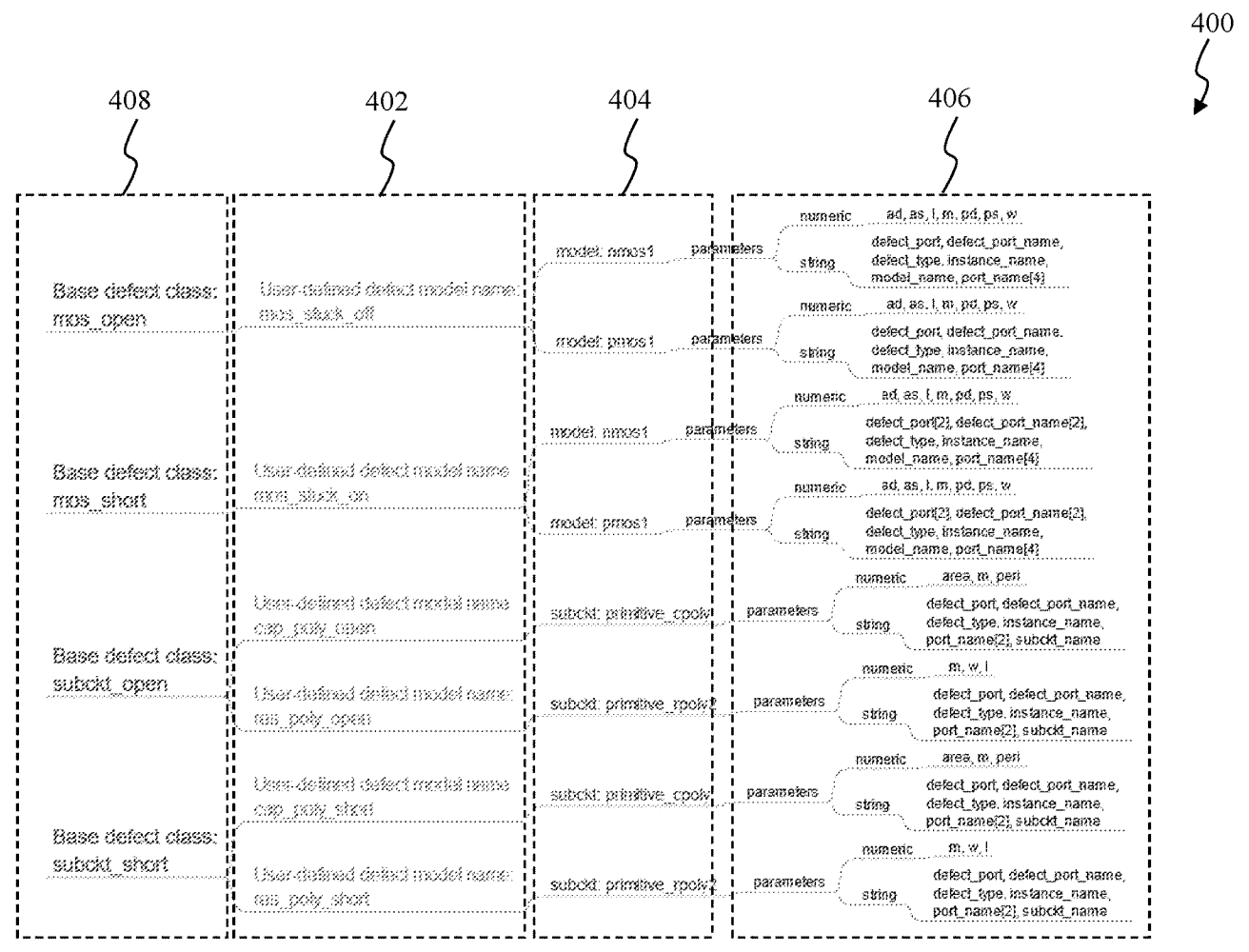

FIG. 3 illustrates a flowchart of an operational control flow for generating a defect catalog according to an exemplary embodiment of the present disclosure. FIG. 4 illustrates an operational control flow for generating a defect catalog according to an exemplary embodiment of the present disclosure. The disclosure is not limited to this operational description. Rather, it will be apparent to ordinary persons skilled in the relevant art(s) that other operational control flows are within the scope of the present disclosure. The following discussion describes an exemplary operational control flow 300 for generating a defect catalog which identifies one or more defects to be simulated, such as stuck-on faults, stuck-off faults, open circuit faults, and/or short circuit faults to provide some examples, within one or more analog components and/or one or more analog circuits of one or more electronic devices and one or more modeling parameters that are associated with these identified defects. Moreover, the following discussion of the exemplary operational control flow 300 is aided using a defect catalog 400 as illustrated in FIG. 4 as a non-limiting example. In the exemplary embodiment illustrated in FIG. 3, one or more computer systems, to be described in further detail below, can execute the simulation application 106, as described above in FIG. 1, to perform the operational control flow 300 as to be described in further detail below. The operational control flow 300 further describes the operation 202 as described above in FIG. 2.

At operation 302, the operational control flow 300 enumerates a defect universe identifying one or more electronic component defect models for one or more analog components and/or one or more analog circuits of one or more electronic devices and one or more defects to be simulated by the one or more electronic component defect models. Generally, the defect universe represents a universal defect catalog identifying the one or more defects to be simulated, such as stuck-on faults, stuck-off faults, open circuit faults, and/or short circuit faults to provide some examples, and the one or more electronic component defect models that are to be simulated for these defects. For example, as illustrated in FIG. 4, the defect universe identifies electronic component defect models 404, such as model: nmos1, model:pmos1, subckt:primitive_cpoly, and subckt:primitive_rpoly2 to provide some examples and one or more defects, such as mos_stuck_off, mos_stuck_on, cap_poly_open, res_poly_open, cap_poly_short, res_poly_short, to be simulated by the electronic component defect models 404. In the exemplary embodiment illustrated in FIG. 3, the operational control flow 300 can scan, for each of the one or more defects, a high-level software level description of the one or more electronic devices for the one or more electronic component defect models that are to be simulated for this defect. In an exemplary embodiment, the one or more high-level software level descriptions can represent a textual representation of the one or more electronic devices, such as a netlist; a high-level software model of the electronic circuit using a high-level software language, such as a graphical design tool, for example C, System C, C++, LabVIEW, and/or MATLAB, a general purpose system design language, such as like SysML, SMDL and/or SSDL, or a high-level software format, such as Common Power Format (CPF), Unified Power Formant (UPF); or an image-based representation of the electronic circuit, such as a computer-aided design (CAD) model to provide an example. Thereafter, in the exemplary embodiment illustrated in FIG. 3, the operational control flow 300 can store the universal defect catalog identifying the one or more defects to be simulated and/or the one or more electronic component defect models that are to be simulated for these defects.

At operation 304, the operational control flow 300 associates the one or more electronic component defect models from the universal defect catalog of operation 302 with one or more modeling parameters. As illustrated in FIG. 4, the operational control flow 300 can associate electronic component defect models 404 with modeling parameters 406. In the exemplary embodiment illustrated in FIG. 3, the one or more modeling parameters can include Simulation Program with Integrated Circuit Emphasis (SPICE) modeling parameters. Generally, these SPICE modeling parameters can include one or more parasitic circuit elements and/or one or more process related parameters which can be used to model behaviors of the analog components and/or the electronic circuits. In the exemplary embodiment illustrated in FIG. 3, the operational control flow 300 can select each of the one or more electronic component defect models from the universal defect catalog of operation 302. Thereafter, the operational control flow 300 associates each of the one or more electronic component defect models with the one or more modeling parameters. In some embodiments, the operational control flow 300 accesses the high-level software level description of the electronic circuit to identify one or more modeling parameters related to the one or more electronic component defect models when the one or more electronic component defect models are related to the analog components and/or the electronic circuit. In these embodiments, the operational control flow 300 can store these modeling parameters and their respective values, the name of the analog component, the electronic circuit, or the electronic device, and names of the nodes within the circuit that touch the terminals of the analog component. In other embodiments, the operational control flow 300 can store names of circuit nodes within the one or more analog components, the one or more electronic circuits, or the one or more electronic devices, and/or effective parasitic capacitances between these circuit nodes when the one or more electronic component defect models is related to a short circuit between these circuit nodes. In further embodiments, the operational control flow 300 can store names of circuit nodes within the one or more analog components, the one or more electronic circuits, or the one or more electronic devices, and/or effective parasitic resistances between these circuit nodes when the one or more electronic component defect models is related to a short circuit between these circuit nodes.

At operation 306, the operational control flow 300 selectively groups the one or more electronic component defect models from the universal defect catalog of operation 302 into unique defect classes that have similar modeling parameters to generate the defect catalog which identifies the unique defect classes to be simulated and one or more modeling parameters that are associated with these unique defect classes. From the example above, as illustrated in FIG. 4, the operational control flow 300 can selectively group the electronic component defect models 404 into user-defined defect model names 402 that have similar modeling parameters from among the modeling parameters 406 to generate the defect catalog 400. In some embodiments, the operational control flow 300 can additionally, or alternatively, group the user-defined defect model names 402 into unique defect classes 408 that have similar modeling parameters from among the modeling parameters 406 to generate the defect catalog 400. In some embodiments, defect catalog 400 can identify the user-defined defect model names 402 and/or the unique defect classes 408 to be simulated and the modeling parameters 406 that are associated with the user-defined defect model names 402 and/or the unique defect classes 408. In the exemplary embodiment illustrated in FIG. 3, the operational control flow 300 can select one or more of the electronic component defect models, such as the "model: nmos1" as illustrated in FIG. 404, from the defect universe of operation 302 and can identify the one or more modeling parameters associated with this selected electronic component defect model, such as the numeric parameters ad, as, l, m, pd, ps, w and/or the string parameters defect_port, defect_port_name, defect_type, instance_name, model_name, port_name as illustrated in FIG. 4. Thereafter, the operational control flow 300 iteratively scans the associated modeling parameters of other similar electronic component defect models that are similarly associated with these modeling parameters. The operational control flow 300 groups those other similar electronic component defect models that are associated with similar modeling parameters with the selected electronic component defect model into a defect class. In the exemplary embodiment illustrated in FIG. 3, the operational control flow 300 iteratively repeats this selecting, scanning, and grouping for each of the electronic component defect models from the defect universe of operation 302 to effectively organization and/or simplify the defect universe of operation 302 to generate the defect catalog.

Exemplary Defect Weight Functions

Figure 5:
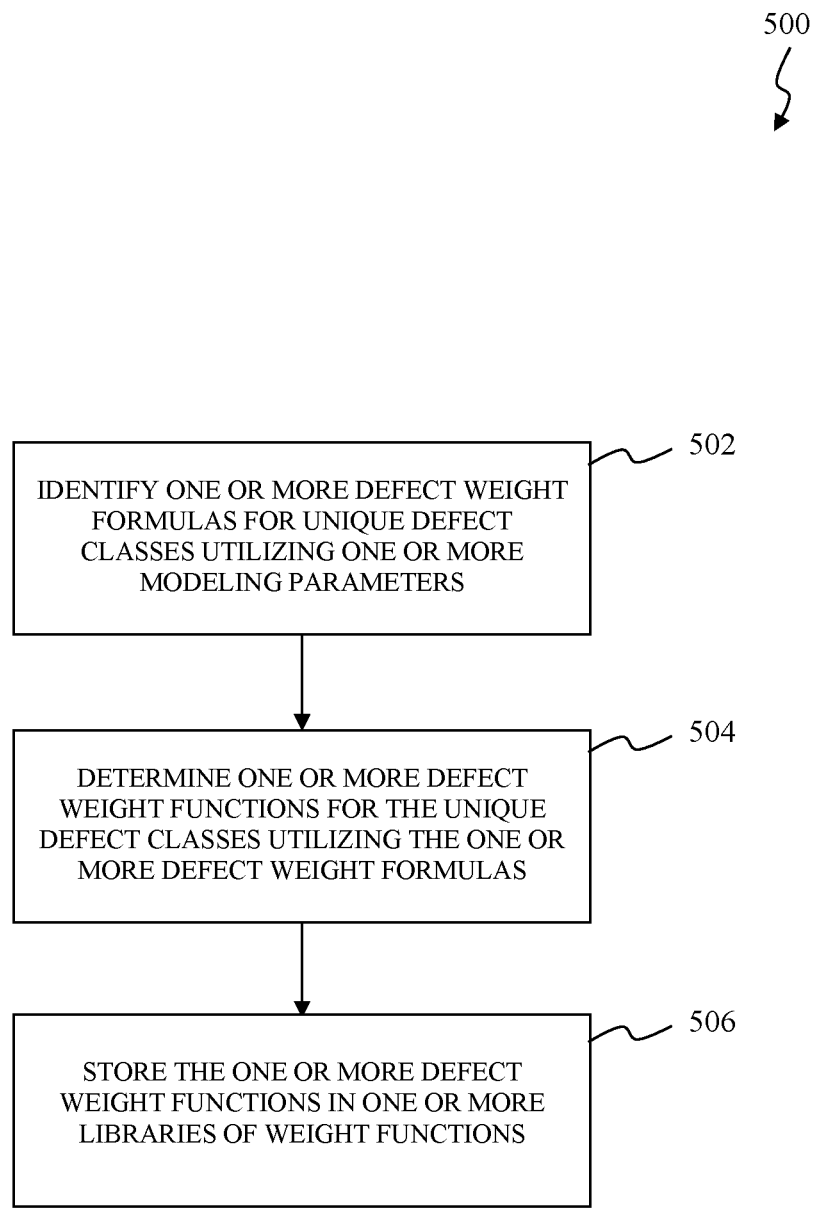
FIG. 5 illustrates a flowchart of a procedure for generating one or more defect weight functions for defects identified in a defect catalog according to an exemplary embodiment of the present disclosure.
Figure 6:
FIG. 6 graphically illustrates defect weight functions according to an exemplary embodiment of the present disclosure.

FIG. 5 illustrates a flowchart of a procedure for generating one or more defect weight functions for defects identified in a defect catalog according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 500 for determining defect weight functions for the one or more defects to be simulated utilizing the one or more modeling parameters that are associated with these identified defects. Moreover, the following discussion of the exemplary operational control flow 500 is aided using defect weight functions 600 as illustrated in FIG. 6 as a non-limiting example In the exemplary embodiment illustrated in FIG. 5, one or more computer systems one or more computer systems, to be described in further detail below, can execute the simulation application 106, as described above in FIG. 1, to perform the operational control flow 500 as to be described in further detail below. The operational control flow 500 further describes the operation 204 as described above in FIG. 2.

At operation 502, the operational control flow 500 identifies one or more defect weight formulas for the unique defect classes identified in a defect catalog, such as the defect catalog as described above in FIG. 3, utilizing one or more modeling parameters identified in the defect catalog. Generally, the one or more defect weight formulas can identify various weights, often, in relation to the one or more modeling parameters, for the unique defect classes from operation 502. In some embodiments, the operational control flow 500 can receive the one or more defect weight formulas from a user. In these embodiments, the user can derive the one or more defect weight formulas, for example, by relying upon prior knowledge of the one or more defects in prior electronic devices, upon prior knowledge of prior analog defect simulations in these electronic devices, information relating to designing and manufacturing of these prior electronic devices, and/or upon literature relating the one or more defects. In the exemplary embodiment illustrated in FIG. 5, the one or more defect weight formulas for the unique defect classes can be expressed in terms of the values of the one or more modeling parameters associated with the unique defect classes. For example, as illustrated in FIG. 6, the one or more defect weight formulas for a mos_open defect class from among unique defect classes 602 can be expressed in terms of whether a defect_port0 modeling parameter from among the one or more modeling parameters is a drain (d), a source (s), a gate (g), or a body (B) of a transistor. Alternatively, or in addition to, the one or more modeling parameters can be utilized by the one or more defect weight formulas to mathematically calculate one or more weights for the unique defect classes. As illustrated in FIG. 6, the one or more defect weight formulas for a mos_short defect class from among the unique defect classes 602 can utilize a width (w) modeling parameter from among the one or more modeling parameters in mathematically calculating the one or more weights for the mos_short defect class.

At operation 504, the operational control flow 500 generates one or more defect weight functions for the unique defect classes from operation 502 utilizing one or more defect weight formulas. In the exemplary embodiment illustrated in FIG. 5, the operational control flow 500 can selectively express the utilizing one or more defect weight formulas in terms of a programming language to generate the one or more defect weight functions. The programming language can include assembler instructions, instruction-set-architecture (ISA) instructions, machine instructions, machine dependent instructions, microcode, firmware instructions, state-setting data, or either source code or object code written in any combination of one or more higher level languages, such as procedural programming languages, for example, the C programming language or similar programming languages (such as SystemC), or object oriented programming language such as Python®, Smalltalk®, C++ or the like, and any other suitable programming languages that will be apparent to those skilled in the relevant art(s) without departing from the scope of the present disclosure.

In the exemplary embodiment illustrated in FIG. 5, the operational control flow 500 groups the defect weight formulas from operation 502 for each defect class and thereafter expresses these defect weight formulas for each defect class in terms of the programming language to provide a corresponding defect weight function from among the one or more defect weight functions. For example, as illustrated in FIG. 6, the one or more defect weight functions for the mos_open defect class includes a first defect weight function that assigns a weight of one (1) to the mos_open defect class when the defect_port0 modeling parameter is a drain (d), a source (s), or a gate (g) of a transistor and a second defect weight function that assigns a weight of zero (0) to the mos_open defect class when the defect_port0 modeling parameter is a body (B) of the transistor. In this example, the operational control flow 500 formats the first defect weight function and the second defect weight function one or more defect weight functions from operation 502 to be in the C++ object oriented programming language to provide one or more defect weight functions for the mos_open defect class from defect weight functions 604 as illustrated in FIG. 6.

In the exemplary embodiment illustrated in FIG. 5, the one or more defect weight functions represent one or more subroutines, one or more procedures, one or more routines, one or more methods, or one or more subprograms that, when complied, can be called by, for example, the exemplary operational control flow 200 as described above in FIG. 2. The one or more defect weight functions, when called by, for example, the exemplary operational control flow 200 as described above in FIG. 2, return their corresponding one or more defect weights. Generally, the one or more defect weight functions can receive one or more modeling parameters corresponding to the unique defect classes from operation 502 as their inputs and can return the one or more defect weights corresponding to the unique defect classes from operation 502 as their outputs. And, generally, the bodies of these more defect weight formulas can include the one or more defect weights for the unique defect classes from operation 502.

At operation 506, the operational control flow 500 can store the one or more defect weight functions in one or more libraries of weight functions, such as one or more dynamic-link libraries (DLLs) to provide an example, which are accessible by the exemplary analog defect simulation. In the exemplary embodiment illustrated in FIG. 5, the operational control flow 500 can include one or more function calls which can cause the operational control flow 500 to access the one or more libraries of weight functions to call the one or more defect weight functions from operation 504. The one or more defect weight functions, when called by the exemplary analog defect simulation, return one or more weights as outlined by the one or more defect weight functions from operation 504.

Exemplary Computer System for Implementing the Exemplary Design Platform

Figure 7:
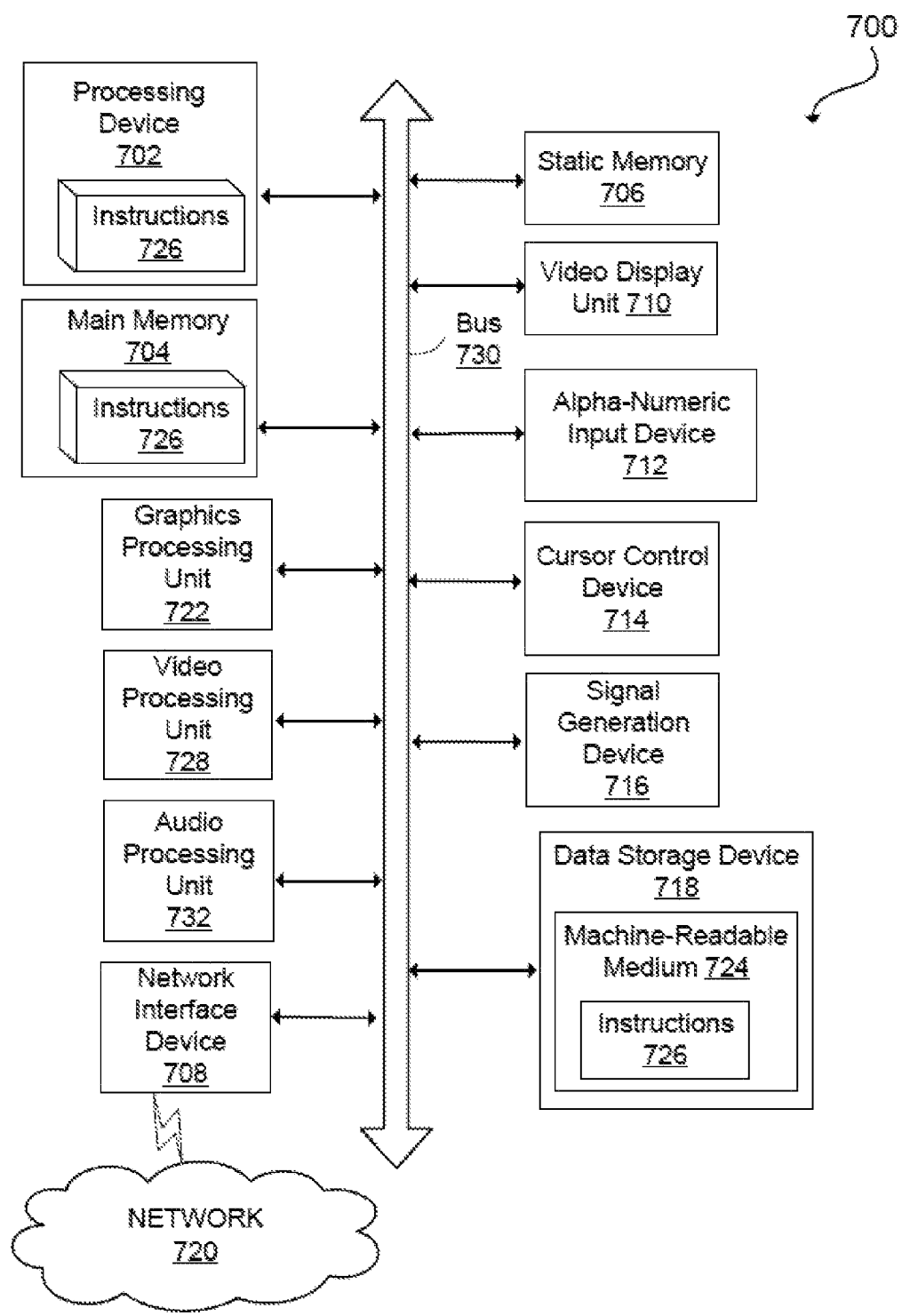
FIG. 7 illustrates a block diagram of a computer system for implementing a design platform according to an exemplary embodiment of the present disclosure.

FIG. 7 illustrates a block diagram of a computer system for implementing a design platform according to an exemplary embodiment of the present disclosure. In alternative implementations, the computer system may be connected (e.g., networked) to other computer systems in a LAN, an intranet, an extranet, and/or the Internet. The computer system may operate in the capacity of a server or a client computer system in client-server network environment, as a peer computer system in a peer-to-peer (or distributed) network environment, or as a server or a client computer system in a cloud computing infrastructure or environment.

The computer system may be a personal computer (PC), a tablet PC, a set-top box (STB), a Personal Digital Assistant (PDA), a cellular telephone, a web appliance, a server, a network router, a switch or bridge, or any computer system capable of executing a set of instructions (sequential or otherwise) that specify actions to be taken by that computer system. Further, while a single computer system is illustrated, the term "computer system" shall also be taken to include any collection of computer systems that individually or jointly execute a set (or multiple sets) of instructions to perform any one or more of the methodologies discussed herein.

In the exemplary embodiment illustrated in FIG. 7, the computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

The processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a computer system-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting computer system-readable storage media.

In some implementations, the instructions 726 include instructions to implement functionality corresponding to the present disclosure. While the computer system-readable storage medium 724 is shown in an example implementation to be a single medium, the term "computer system-readable storage medium" should be taken to include a single medium or multiple media (e.g., a centralized or distributed database, and/or associated caches and servers) that store the one or more sets of instructions. The term "computer system-readable storage medium" shall also be taken to include any medium that is capable of storing or encoding a set of instructions for execution by the computer system and that cause the computer system and the processing device 702 to perform any one or more of the methodologies of the present disclosure. The term "computer system-readable storage medium" shall accordingly be taken to include, but not be limited to, solid-state memories, optical media, and magnetic media.

CONCLUSION

Some portions of the preceding detailed descriptions have been presented in relation to algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a computer system-readable medium having stored thereon instructions, which may be used to program a computer system (or other electronic devices) to perform a process according to the present disclosure. A computer system-readable medium includes any mechanism for storing information in a form readable by a computer system (e.g., a computer). For example, a computer system-readable (e.g., computer-readable) medium includes a computer system (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A computer system for performing an analog defect simulation on an electronic device, the computer system comprising:
   a memory that stores a plurality of instructions; and
   a processor configured to execute the plurality of instructions, the plurality of instructions, when executed by the processor, configuring the processor to:
      generate a defect catalog which identifies a plurality of defect classes relating to a plurality of defects and a plurality of modeling parameters that are associated with the plurality of defect classes,
      identify a defect weight formula that specifies a weight for a defect class from among the plurality of defect classes in relation to a corresponding modeling parameter from among the plurality of modeling parameters,
      call a defect weight function to return the weight from the defect weight formula,
      perform the analog defect simulation on the electronic device, and
      determine a simulation statistic relating to the analog defect simulation utilizing the weight.

2. The computer system of claim 1, wherein the plurality of instructions, when executed by the processor, further configures the processor to:
   enumerate a defect universe for the electronic device which identifies a plurality of electronic component defect models for the electronic device and the plurality of defects to be simulated by the plurality of electronic component defect models;
   associate the plurality of electronic component defect models with corresponding modeling parameters from among a plurality of modeling parameters;
   group electronic component defect models from among the plurality of electronic component defect models that have similar modeling parameters from among the plurality of modeling parameters into corresponding defect classes from among the plurality of defect classes to generate the defect catalog.

3. The computer system of claim 2, wherein the plurality of instructions, when executed by the processor, configures the processor to:
   scan a software level description of the electronic device for the plurality of electronic component defect models that are to be simulated for the plurality of defects.

4. The computer system of claim 1, wherein the plurality of modeling parameters comprises a plurality of Simulation Program with Integrated Circuit Emphasis (SPICE) modeling parameters for one or more analog components or one or more analog circuits of the electronic device.

5. The computer system of claim 1, wherein the plurality of instructions, when executed by the processor, further configures the processor to express the defect weight formula in a programming language to generate the defect weight function.

6. The computer system of claim 5, wherein the plurality of instructions, when executed by the processor, further configures the processor to receive the defect weight formula from a user of the computer system.

7. The computer system of claim 1, wherein the plurality of instructions, when executed by the processor, further configures the processor to:
   store the defect weight function in a library, and
   access the defect weight function from the library.

8. A method for performing an analog defect simulation on an electronic device, the method comprising:
   generating, by a computer system, a defect catalog which identifies a plurality of defect classes relating to a plurality of defects and a plurality of modeling parameters that are associated with the plurality of defect classes;
   identifying, by the computer system, a defect weight formula that specifies a weight for a defect class from among the plurality of defect classes in relation to a corresponding modeling parameter from among the plurality of modeling parameters;
   calling, by the computer system, a defect weight function to return the weight from the defect weight formula;
   performing, by the computer system, the analog defect simulation on the electronic device; and
   determining, by the computer system, a simulation statistic relating to the analog defect simulation utilizing the weight.

9. The method of claim 8, further comprising:
   enumerating, by the computer system, a defect universe for the electronic device which identifies a plurality of electronic component defect models for the electronic device and the plurality of defects to be simulated by the plurality of electronic component defect models;
   associating, by the computer system, the plurality of electronic component defect models with corresponding modeling parameters from among a plurality of modeling parameters;
   grouping, by the computer system, electronic component defect models from among the plurality of electronic component defect models that have similar modeling parameters from among the plurality of modeling parameters into corresponding defect classes from among the plurality of defect classes to generate the defect catalog.

10. The method of claim 9, further comprising:
    scanning, by the computer system, a software level description of the electronic device for the plurality of electronic component defect models that are to be simulated for the plurality of defects.

11. The method of claim 8, wherein the plurality of modeling parameters comprises a plurality of Simulation Program with Integrated Circuit Emphasis (SPICE) modeling parameters for one or more analog components or one or more analog circuits of the electronic device.

12. The method of claim 8, further comprising:
    expressing, by the computer system, the defect weight formula in a programming language to generate the defect weight function.

13. The method of claim 12, further comprising receiving, by the computer system, the defect weight formula from a user of the computer system.

14. The method of claim 8, further comprising:
  storing, by the computer system, the defect weight function in a library, and
  accessing, by the computer system, the defect weight function from the library.

15. A computer system for performing an analog defect simulation on analog components of an electronic device, the computer system comprising:
  a memory that stores a defect weight function having a defect weight formula that specifies a weight for a defect class from among a plurality of defect classes identified in a defect catalog; and
  a processor configured to execute a plurality of instructions, the plurality of instructions, when executed by the processor, configuring the processor to:
    call the defect weight function stored in the memory to return the weight from the defect weight formula;
    perform the analog defect simulation on the electronic device; and
    determine a simulation statistic relating to the analog defect simulation utilizing the weight.

16. The computer system of claim 15, wherein the plurality of instructions, when executed by the processor, further configures the processor to:
  enumerate a defect universe for the electronic device which identifies a plurality of electronic component defect models for the electronic device and a plurality of defects to be simulated by the plurality of electronic component defect models;
  associate the plurality of electronic component defect models with corresponding modeling parameters from among a plurality of modeling parameters;
  group electronic component defect models from among the plurality of electronic component defect models that have similar modeling parameters from among the plurality of modeling parameters into corresponding defect classes from among the plurality of defect classes to generate a defect catalog which identifies a plurality of defect classes relating to a plurality of defects and a plurality of modeling parameters that are associated with the plurality of defect classes to generate a defect catalog which identifies the plurality of defect classes relating to the plurality of defects and the plurality of modeling parameters that are associated with the plurality of defect classes.

17. The computer system of claim 16, wherein the plurality of instructions, when executed by the processor, further configures the processor to:
  identify the defect weight formula that specifies the weight for a defect class from among the plurality of defect classes in relation to a corresponding modeling parameter from among the plurality of modeling parameters;
  express the defect weight formula in a programming language to generate the defect weight function; and
  store the defect weight function in the memory.

18. The computer system of claim 15, wherein the plurality of instructions, when executed by the processor, further configures the processor to:
  store the defect weight function in a library stored in the memory, and
  access the defect weight function from the library.

19. The computer system of claim 16, wherein the plurality of modeling parameters comprises a plurality of Simulation Program with Integrated Circuit Emphasis (SPICE) modeling parameters for one or more analog components or one or more analog circuits of the electronic device.

20. The computer system of claim 15, wherein the plurality of instructions, when executed by the processor, further configures the processor to receive the defect weight formula from a user of the computer system.

* * * * *